(12) United States Patent
Akutsu et al.

(10) Patent No.: US 11,732,105 B2
(45) Date of Patent: Aug. 22, 2023

(54) FILLER DISPOSITION FILM

(71) Applicant: DEXERIALS CORPORATION, Shimotsuke (JP)

(72) Inventors: Yasushi Akutsu, Utsunomiya (JP); Reiji Tsukao, Utsunomiya (JP)

(73) Assignee: DEXERIALS CORPORATION, Tokyo (JP)

( * ) Notice: Subject to any disclaimer, the term of this patent is extended or adjusted under 35 U.S.C. 154(b) by 81 days.

(21) Appl. No.: 17/513,432

(22) Filed: Oct. 28, 2021

(65) Prior Publication Data

US 2022/0135753 A1 May 5, 2022

Related U.S. Application Data

(63) Continuation of application No. 16/087,598, filed as application No. PCT/JP2017/016228 on Apr. 24, 2017, now abandoned.

(30) Foreign Application Priority Data

| May 5, 2016 | (JP) | ................................. 2016-092900 |
| Apr. 23, 2017 | (JP) | ................................. 2017-084916 |

(51) Int. Cl.
  *C08K 3/013* (2018.01)
  *C08J 3/20* (2006.01)
  (Continued)

(52) U.S. Cl.
  CPC .............. *C08K 3/013* (2018.01); *B29C 59/02* (2013.01); *B29C 70/64* (2013.01); *B32B 27/20* (2013.01);
  (Continued)

(58) Field of Classification Search
  None
  See application file for complete search history.

(56) References Cited

U.S. PATENT DOCUMENTS 4,606,962 A * 8/1986 Reylek ................ H01L 23/3737
                                                        428/323
4,931,598 A * 6/1990 Calhoun .................. H01R 4/04
                                                        174/117 FF (Continued)

FOREIGN PATENT DOCUMENTS

JP        62005845 A *  1/1987
JP        01124977 A *  5/1989   ............... H01B 5/16
(Continued)

OTHER PUBLICATIONS

Feb. 8, 2022 Office Action issued in Japanese Application No. 2017-084916.

(Continued)

*Primary Examiner* — Jeffrey A Vonch
(74) *Attorney, Agent, or Firm* — Oliff PLC

(57) ABSTRACT

A filler disposition film that can use a commercially procurable filler material having good particle diameter uniformity, enables high positional precision of the filler disposition, can support even an increase in the surface area, and has a prescribed filler regularly disposed in a long resin film. Moreover, the rate of consistency of disposition of the filler in the filler disposition film in rectangular areas of a prescribed size having a length of 1000 times or more the average particle diameter of the prescribed filler, and a width of 0.2 mm or greater is 90% or greater. Such a rectangular area has a long-side direction that is substantially parallel to the long-side direction of the filler disposition film, and a widthwise direction that is substantially parallel to a short-side direction of the filler disposition film. The average particle diameter of the regularly disposed filler is from 0.4 μm to 100 μm.

21 Claims, 7 Drawing Sheets

(51) Int. Cl.

| | | |
|---|---|---|
| C08J 5/18 | (2006.01) | |
| B32B 5/16 | (2006.01) | |
| B32B 27/20 | (2006.01) | |
| H01R 11/01 | (2006.01) | |
| C08K 7/16 | (2006.01) | |
| H01L 23/00 | (2006.01) | |
| H05K 3/32 | (2006.01) | |
| B29C 59/02 | (2006.01) | |
| B29C 70/64 | (2006.01) | |
| C08K 5/00 | (2006.01) | |
| C08K 7/00 | (2006.01) | |
| B29L 7/00 | (2006.01) | |
| C09J 9/02 | (2006.01) | |
| H01B 5/16 | (2006.01) | |
| C09J 7/10 | (2018.01) | |

(52) U.S. Cl.
CPC . *C08J 3/20* (2013.01); *C08J 5/18* (2013.01); *C08K 5/00* (2013.01); *C08K 7/00* (2013.01); *C08K 7/16* (2013.01); *H01L 24/29* (2013.01); *H05K 3/323* (2013.01); *B29C 2059/028* (2013.01); *B29K 2905/08* (2013.01); *B29L 2007/008* (2013.01); *B32B 5/16* (2013.01); *B32B 2264/02* (2013.01); *B32B 2264/105* (2013.01); *B32B 2264/107* (2013.01); *B32B 2264/202* (2020.08); *B32B 2264/302* (2020.08); *B32B 2264/303* (2020.08); *B32B 2264/305* (2020.08); *B32B 2264/403* (2020.08); *B32B 2264/501* (2020.08); *B32B 2264/504* (2020.08); *B32B 2307/202* (2013.01); *B32B 2405/00* (2013.01); *B32B 2457/00* (2013.01); *C08J 2333/10* (2013.01); *C08J 2371/12* (2013.01); *C08J 2463/00* (2013.01); *C08K 2201/001* (2013.01); *C09J 7/10* (2018.01); *C09J 9/02* (2013.01); *C09J 2203/326* (2013.01); *C09J 2301/408* (2020.08); *C09J 2301/412* (2020.08); *H01B 5/16* (2013.01); *H01L 2924/07811* (2013.01); *H01R 11/01* (2013.01); *Y10S 428/906* (2013.01); *Y10T 428/24521* (2015.01); *Y10T 428/24545* (2015.01); *Y10T 428/24612* (2015.01); *Y10T 428/25* (2015.01); *Y10T 428/252* (2015.01); *Y10T 428/254* (2015.01); *Y10T 428/256* (2015.01); *Y10T 428/28* (2015.01)

(56) References Cited

U.S. PATENT DOCUMENTS

| | | | |
|---|---|---|---|
| 5,300,340 A | | 4/1994 | Calhoun et al. |
| 5,366,140 A * | | 11/1994 | Koskenmaki ............ H01L 24/29 228/56.3 |
| 6,042,894 A * | | 3/2000 | Goto .................. H01B 1/22 427/205 |
| 6,402,876 B1 * | | 6/2002 | McArdle ................. H01R 4/04 156/247 |
| 6,423,172 B1 * | | 7/2002 | McArdle ................. B05D 7/00 156/305 |
| 6,512,184 B1 * | | 1/2003 | Yamada .................... H01R 4/04 174/259 |
| 6,671,024 B1 * | | 12/2003 | Uchiyama ............. H01L 24/29 349/149 |
| 2001/0008169 A1 | | 7/2001 | Connell et al. |
| 2002/0119255 A1 * | | 8/2002 | Divigalpitiya .......... B05B 5/057 427/482 |
| 2005/0077542 A1 * | | 4/2005 | Asai ................. H01L 23/49827 257/200 |
| 2005/0276918 A1 * | | 12/2005 | Tam ........................ H01R 4/04 427/180 |
| 2006/0280912 A1 * | | 12/2006 | Liang ...................... H01B 1/22 428/173 |
| 2007/0175579 A1 * | | 8/2007 | Otani ..................... H05K 3/323 428/323 |
| 2009/0090545 A1 * | | 4/2009 | Usui ...................... H01L 24/83 156/60 |
| 2009/0239082 A1 * | | 9/2009 | Fujita .................... H05K 3/323 428/413 |
| 2010/0101700 A1 * | | 4/2010 | Liang .................... B32B 27/16 156/73.6 |
| 2010/0116533 A1 * | | 5/2010 | Ishimatsu ............. H05K 3/323 428/323 |
| 2010/0188829 A1 * | | 7/2010 | Ito ........................ H05K 3/323 428/323 |
| 2010/0285305 A1 * | | 11/2010 | Akutsu ................... H01L 24/32 428/323 |
| 2010/0294547 A1 * | | 11/2010 | Hatanaka ............ H01R 12/714 29/877 |
| 2012/0114920 A1 * | | 5/2012 | Yoon ..................... C30B 29/60 428/206 |
| 2012/0168218 A1 * | | 7/2012 | Tomita ............... H01R 13/2435 174/262 |
| 2014/0141195 A1 * | | 5/2014 | Liang ........................ C09J 9/02 428/98 |
| 2014/0261992 A1 | | 9/2014 | Liang et al. |
| 2015/0072109 A1 * | | 3/2015 | Liang ....................... H01B 3/307 252/500 |
| 2015/0208511 A1 * | | 7/2015 | Ishimatsu ............... H01L 24/32 156/229 |
| 2015/0214176 A1 * | | 7/2015 | Shinohara ............... H01L 24/83 361/767 |
| 2015/0231803 A1 * | | 8/2015 | Shinohara ............... H01L 24/29 264/496 |
| 2015/0240130 A1 * | | 8/2015 | Liang ........................ C09J 7/20 428/206 |
| 2015/0271918 A1 * | | 9/2015 | Akutsu ..................... H01B 1/22 427/508 |
| 2016/0149366 A1 * | | 5/2016 | Akutsu ..................... C09J 9/02 428/206 |
| 2016/0168428 A1 * | | 6/2016 | Shinohara ............... H05K 3/323 428/206 |
| 2016/0270225 A1 * | | 9/2016 | Shinohara ............... H01L 24/29 |
| 2017/0012015 A1 * | | 1/2017 | Tsukao .................... H01L 24/00 |
| 2017/0110806 A1 * | | 4/2017 | Igarashi ................ H01R 43/007 |
| 2017/0226387 A1 * | | 8/2017 | Shinohara ............... H01L 24/27 |
| 2017/0309590 A1 * | | 10/2017 | Tsukao .................... H01L 24/32 |
| 2017/0317047 A1 * | | 11/2017 | Akutsu .................... H01L 24/32 |
| 2017/0323701 A1 * | | 11/2017 | Ishimatsu ................ H01B 5/16 |
| 2017/0352636 A1 * | | 12/2017 | Akutsu .................... H01L 24/32 |
| 2018/0002575 A1 * | | 1/2018 | Sato ......................... C09J 9/02 |
| 2018/0277505 A1 * | | 9/2018 | Hayashi ................... C09J 7/10 |
| 2019/0035763 A1 * | | 1/2019 | Tsukao .................... H01B 1/22 |
| 2019/0139927 A1 * | | 5/2019 | Akutsu .................... H01L 24/27 |
| 2019/0241710 A1 * | | 8/2019 | Tsukao .................... H01R 11/01 |

FOREIGN PATENT DOCUMENTS

| | | | |
|---|---|---|---|
| JP | 06223943 A * | | 8/1994 |
| JP | H07-302666 A | | 11/1995 |
| JP | H08-78075 A * | | 3/1996 |
| JP | H09-320345 A | | 12/1997 |
| JP | H11-514755 A | | 12/1999 |
| JP | 2002332461 A * | | 11/2002 |
| JP | 2003013021 A * | | 1/2003 |
| JP | 2003-35724 A | | 2/2003 |
| JP | 2003208931 A * | | 7/2003 |
| JP | 2003220669 A * | | 8/2003 |
| JP | 2004207689 A * | | 7/2004 |
| JP | 2005019274 A * | | 1/2005 |
| JP | 2005209454 A * | | 8/2005 |
| JP | 2007-3571 A | | 1/2007 |
| JP | 2007009176 A * | | 1/2007 |
| JP | 2007080522 A | | 3/2007 |
| JP | 2007115560 A * | | 5/2007 |
| JP | 2007165052 A * | | 6/2007 |

(56) References Cited

FOREIGN PATENT DOCUMENTS

| JP | 2007186593 | A | * | 7/2007 | |
| --- | --- | --- | --- | --- | --- |
| JP | 2007224111 | A | * | 9/2007 | ............... C09J 7/22 |
| JP | 2007232627 | A | * | 9/2007 | |
| JP | 2009-29861 | A | | 2/2009 | |
| JP | 2010033793 | A | * | 2/2010 | |
| JP | 2010257983 | A | * | 11/2010 | ............... C09J 7/22 |
| JP | 2011192651 | A | * | 9/2011 | ............... H01B 5/16 |
| JP | 2012067311 | A | * | 4/2012 | |
| JP | 5468783 | B2 | | 4/2014 | |
| JP | 2016-126843 | A | | 7/2016 | |
| KR | 2007074310 | A | * | 7/2007 | |
| TW | 200536775 | A | | 11/2005 | |
| TW | 201606800 | A | | 2/2016 | |
| WO | 2015/076234 | A1 | | 5/2015 | |
| WO | 2015/115161 | A1 | | 8/2015 | |
| WO | 2016/002336 | A1 | | 1/2016 | |

OTHER PUBLICATIONS

Sep. 11, 2021 Office Action issued in Korean Patent Application No. 10-2021-7018090.
Sep. 16, 2021 Office Action issued in Taiwanese Patent Application No. 106114398.
Nov. 15, 2018 International Preliminary Report on Patentability issued in International Patent Application PCT/JP2017/016228.
Jul. 25, 2017 International Search Report issued in International Patent Application PCT/JP2017/016228.
Jul. 25, 2017 Written Opinion issued in International Patent Application PCT/JP2017/016228.
Jun. 12, 2018 Written Opinion issued in International Patent Application PCT/JP2017/016228.
Jan. 16, 2020 U.S. Office Action issued U.S. Appl. No. 16/087,598.
Machine Translation of J P-2003286457-A, Oct. 2003 (Year: 2003).
Oct. 12, 2020 Office Action issued in Chinese Application No. 201780025069.1.
Nov. 27, 2020 Office Action issued in Korean Patent Applicaiton 10-2018-7025032.
Dec. 4, 2020 Office Action issued in Taiwanese Patent Application 106114398.
Oct. 12, 2020 Office Action issued in Chinese Patent Application 201780025069.1.
Mar. 20, 2020 Office Action issued in Korean Patent Application No. 10-2018-7025032.
Apr. 28, 2021 U.S. Office Action issued U.S. Appl. No. 16/087,598.
Jun. 1, 2021 Office Action issued in Japanese Patent Application No. 2017-084916.
May 14, 2021 Office Action issued in Chinese Patent Application No. 201780025069.1.
Aug. 27, 2021 Office Action issued in Chinese Patent Application No. 201780025069.1.
Jul. 7, 2022 Office Action issued in Korean Application No. 10-2021-7018090.

* cited by examiner

[FIG. 1]
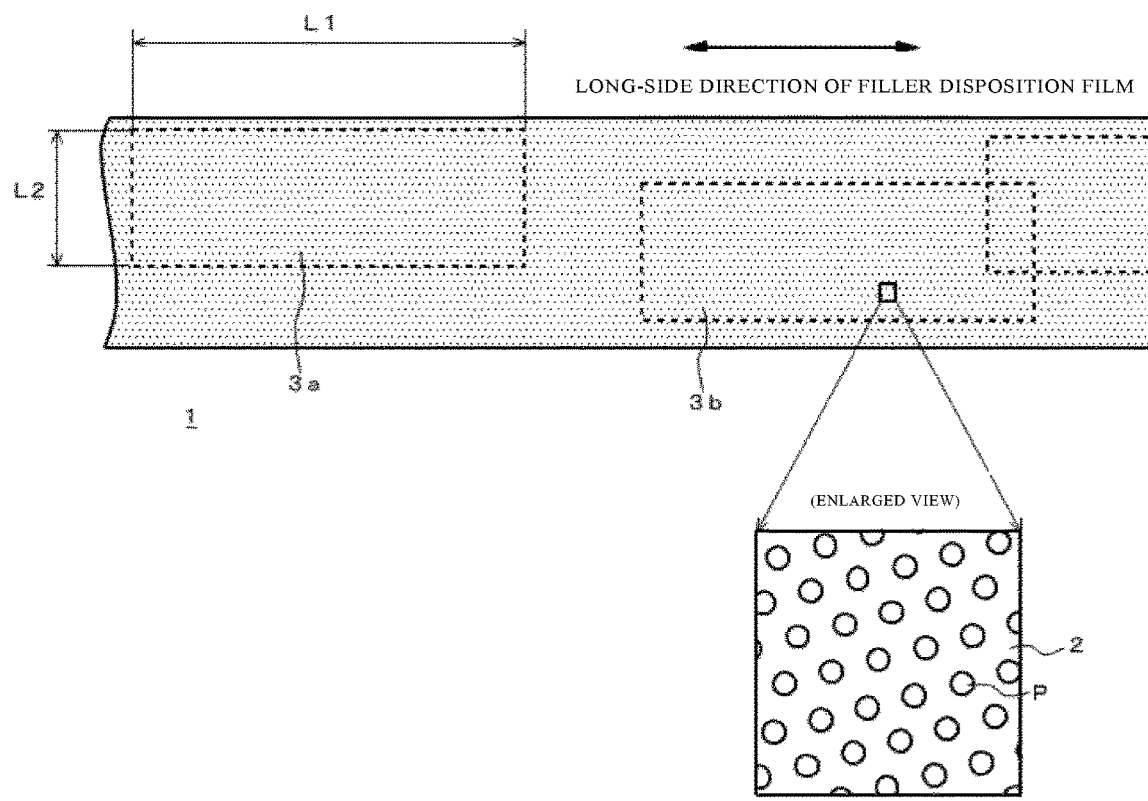

[FIG. 2]
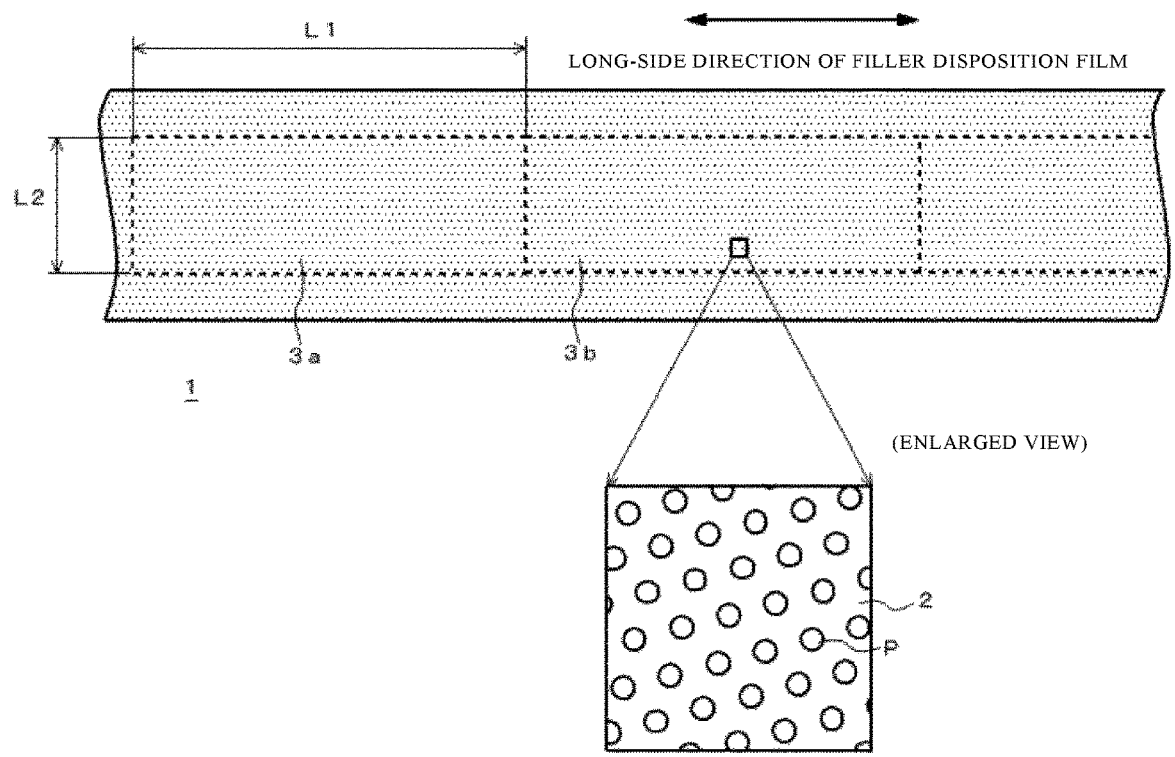

[FIG. 3A]
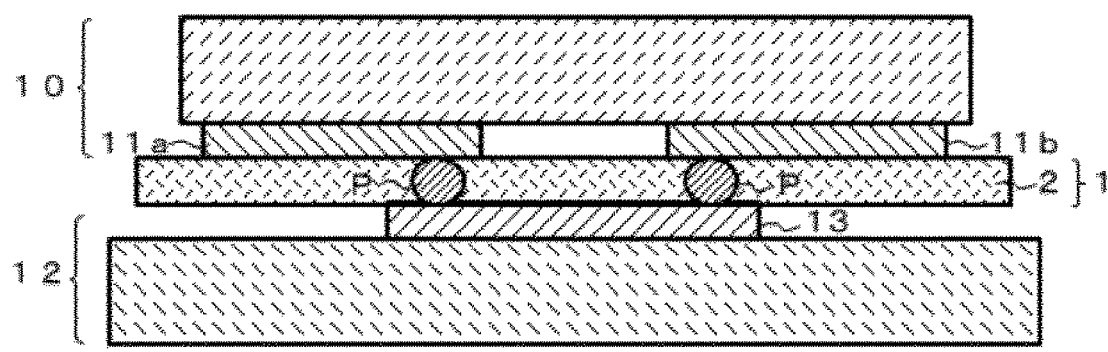

[FIG. 3B]
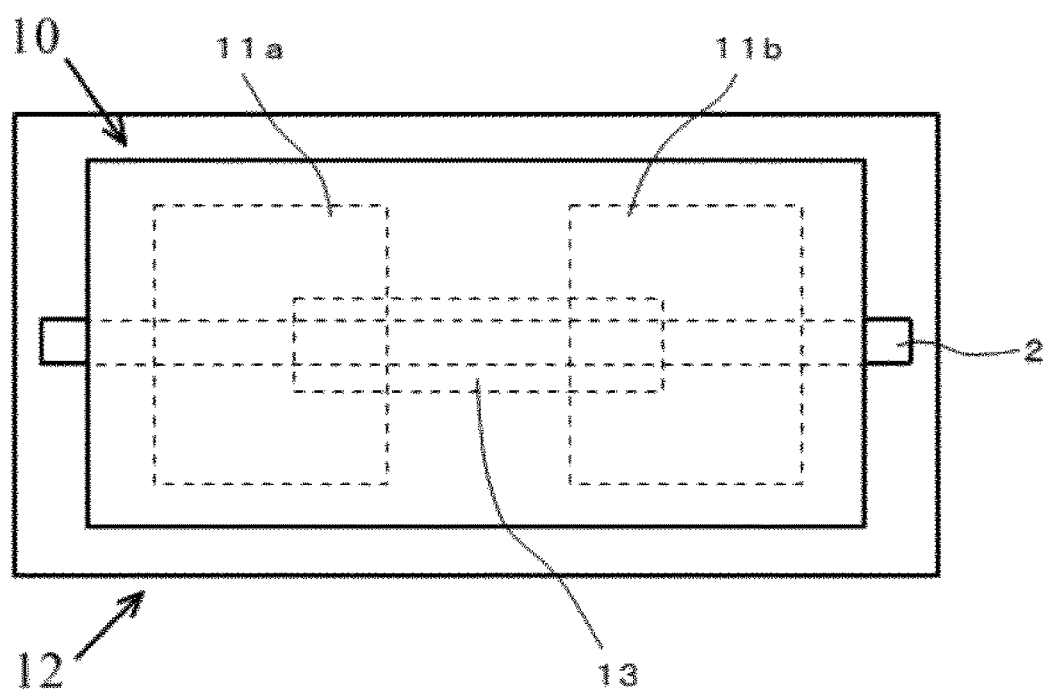

[FIG. 4]
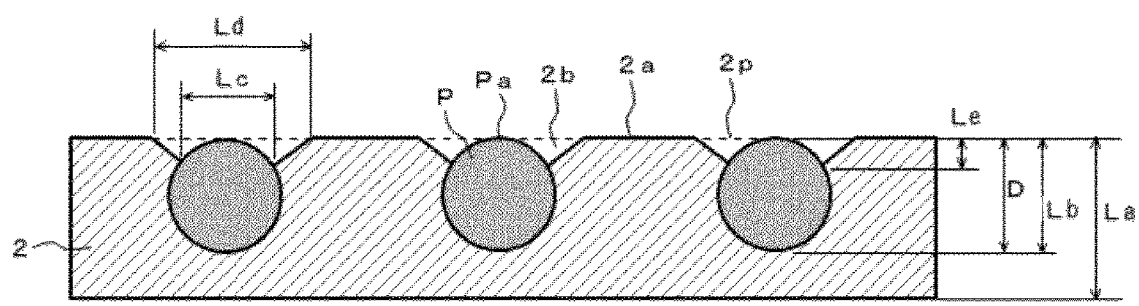
1A

[FIG. 5]
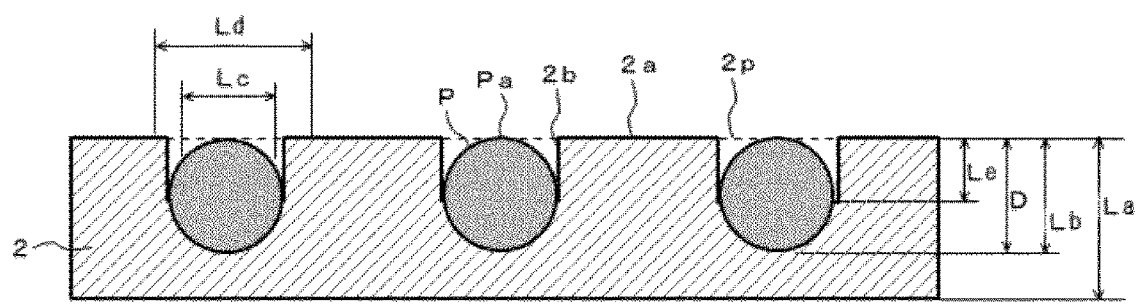
1B

[FIG. 6]
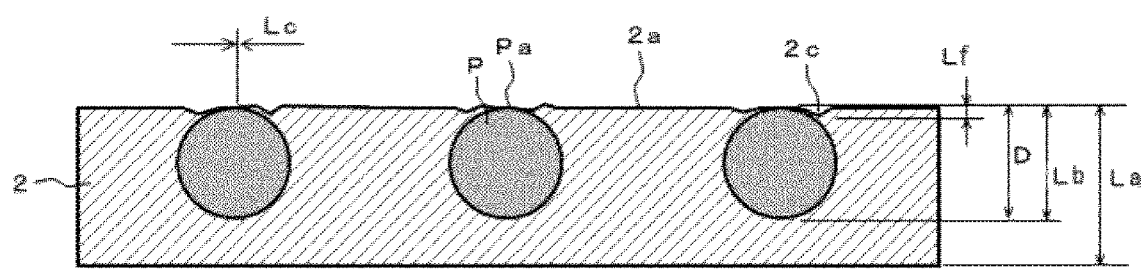
1C

FILLER DISPOSITION FILM

CROSS REFERENCE TO RELATED APPLICATION

This application is a continuation of U.S. application Ser. No. 16/087,598, filed Sep. 21, 2018, the contents of which are incorporated herein by reference.

TECHNICAL FIELD

The present invention relates to a filler disposition film for which a filler is precisely disposed in a resin film.

BACKGROUND ART

Filler-containing films, which contain a filler in a resin film, are used as optical films, surface protection films, heat dissipating films, and conductive films, and the like. With these filler-containing films, ordinarily respective film performances are improved by treating the filler itself, optimizing the size of the filler and the thickness of the film, and adjusting the extent of exposure of the filler. For example, Patent Document 1 proposes a conductive film that contains conductive particles as a filler, wherein a photolithographic technique and a plating technique are used to accurately dispose the conductive particles in an insulating film at prescribed positions.

CITATION LIST

Patent Literature

Patent Document 1: JP H09-320345 A

SUMMARY OF INVENTION

Technical Problem

However, with the technique proposed by Patent Document 1, numerous complex steps are required to dispose the conductive particles at the prescribed positions. Moreover, the conductive particles need to be formed through electroplating, and therefore a problem has existed of not being able to use conductive particles that can be procured from the marketplace with good uniformity in the particle diameter.

Furthermore, to inexpensively and practically supply on an industrial scale these filler disposition films having a filler disposed at prescribed positions, realization of a large surface area is demanded, but such examinations have not been sufficiently conducted in the past, and ordinarily, in a case where a photolithographic technique and a plating technique are utilized to increase the surface area, photolithographic precision and plating precision easily become non-uniform between the central portion and the peripheral edge part, and as a result, the positional precision of the filler disposition decreases. A significant decrease in positional precision in the long-side direction of the resin film is a particular concern.

Therefore, for the purpose of resolving the above-described issues with known technology, an object of the present invention is to provide a filler disposition film which can use a filler material that can be procured in the marketplace, and which enables higher positional precision of the filler disposition compared to known technology, and can support even an increase in the surface area.

Solution to Problem

The inventors of the present invention discovered that with respect to a filler disposition film in which a prescribed filler is regularly disposed in a long resin film, the above-described object can be achieved by setting the rate of consistency of the disposition of the filler in a rectangular area of a prescribed size in the filler disposition film to a specific range or greater, and thereby arrived at the completion of the present invention.

That is, the present invention provides a filler disposition film in which a prescribed filler is regularly disposed in a long resin film, wherein the rate of consistency of disposition of the filler in the filler disposition film in rectangular areas of a prescribed size having a length of 1000 times or more than the average particle diameter of the filler, and a width of 0.2 mm or greater is 90% or greater.

The present invention also provides a film wound body obtained by winding the above-described filler disposition film on a winding core.

Furthermore, the present invention also provides a method for controlling the above-described filler disposition film, the method including: marking in advance before and after an area in which an omission is present with respect to an original disposition of the filler, a non-disposition area, or an area of a different disposition, or recording these areas.

Advantageous Effects of Invention

The filler disposition film of the present invention includes a prescribed filler regularly disposed in a long resin film. Moreover, the rate of consistency of disposition of the filler in rectangular areas of a prescribed size having a length of 1000 times or more than the average particle diameter of the filler, and a width of 0.2 mm or greater is high at 90% or greater.

Furthermore, the filler disposition film of the present invention can be configured using various commercially procurable fillers, and can be produced with high positional precision at prescribed positions of the resin film without directly requiring a photolithographic technique and a plating technique, and therefore the positional precision can be maintained even in a case where the surface area is increased.

The filler disposition film of the present invention can be formed into a wound body, and can also be formed into a sheet. Therefore, new demand can be anticipated for the filler-containing film.

BRIEF DESCRIPTION OF DRAWINGS

FIG. 1 is a schematic plan view of a filler disposition film of the present invention.

FIG. 2 is a schematic plan view of a filler disposition film of the present invention.

FIG. 3A is a cross-sectional view of a conductive path formed between a first electronic component and a second electronic component using the filler disposition film of the present invention.

FIG. 3B is a top perspective view of the conductive path formed between the first electronic component and the second electronic component using the filler disposition film of the present invention.

FIG. 4 is a cross-sectional view of a filler disposition film of the present invention.

FIG. 5 is a cross-sectional view of a filler disposition film of the present invention.

FIG. 6 is a cross-sectional view of a filler disposition film of the present invention.

DESCRIPTION OF EMBODIMENTS

Hereinafter, the filler disposition film of the present invention will be described in detail while referring to the drawings. Note that in the drawings, the same reference characters are used to indicate constituent elements that are the same or equivalent.

Overall Configuration

FIG. 1 is a schematic plan view of a filler disposition film 1 according to one embodiment of the present invention. This filler disposition film 1 has a configuration in which a filler P is regularly disposed in a long resin film 2. A rate of consistency of the disposition of the filler P in rectangular areas 3a and 3b is 90% or greater, preferably 95% or greater, more preferably 98% or greater, even more preferably 99% or greater, yet even more preferably 99.9% or greater, and preferably less than 100%. The rectangular areas 3a and 3b have a prescribed size of a length L1 of 1000 times or more than the average particle diameter D of the filler P and a width L2 of 0.2 mm or greater and is selected from any area in the filler disposition film. By setting the rate of consistency of the filler disposition to 90% or greater, even in a case where all of the filler P in the entire filler disposition film 1 is not necessarily located at the disposition position according to the design, the function of the filler disposition film 1 can be favorably manifested, and the quality in actual use can be stabilized.

Here, the filler P for which the rate of consistency of the filler disposition is examined is the filler that is regularly disposed from amongst the filler configuring the filler disposition film. That is, the filler disposition film 1 of the present invention is a film for which the rate of consistency of the disposition of the regularly disposed filler P is stipulated. In addition to this filler P, the filler disposition film 1 can contain a randomly disposed filler (not illustrated) for which the size or type differs from that of the filler P.

In the present invention, as illustrated in FIG. 2, the rectangular area for which the rate of consistency of the disposition of the filler P is examined can be set as an area for which the rectangular areas 3a and 3b are repeated in the long-side direction of the filler disposition film 1. In particular, one of the rectangular areas for which the rate of consistency of the filler disposition is to be examined is used as an end part of the filler disposition film in the long-side direction, and then the rate of consistency of filler disposition is preferably examined based thereon. With this aspect, a rectangular area for which the rate of consistency of the disposition of the filler P in the rectangular areas is 90% or greater, preferably 95% or greater, more preferably 98% or greater, even more preferably 99% or greater, and yet even more preferably 99.9% or greater is present in the long-side direction of the filler disposition film 1 at a repeating cycle L1.

Resin Film

The stipulation that the resin film in the filler disposition film of the present invention is "long" means that the film length is sufficiently long with respect to the film width. The film length is preferably 50 times or more the film width, preferably 1000 times or more the film width, and more preferably 2500 times or more the film width. When expressed in terms of the specific length, as one example, the length is preferably 0.2 m or greater, and more preferably 0.5 m or greater in consideration of the winding core.

Moreover, the "resin" of the "long resin film" can be selected, as appropriate, from amongst well-known thermoplastic resins, thermosetting resins, photocurable resins, and the like according to the application of the filler disposition film with consideration of the possibility of use in a film formation method such as a coating method. Furthermore, such resins may also contain a reaction initiator as necessary. Examples include polyolefins, polyesters, polyamides, polyimides, and silicone resins. In addition, phenoxy resins, acrylic resins, epoxy resins, and other such resins and rubber components and other such compounded materials which are ordinarily used in well-known pressure-sensitive adhesives and adhesives can also be used. A nanofiller which is significantly smaller than the filler used in the present invention may also be blended as a filler to adjust the viscosity and the like of the resin composition.

Moreover, various characteristics may be imparted to the resin material configuring the resin film 2. For example, a latent curing agent and a resin which reacts therewith in the presence of heat, light or both may be mixed and contained in the resin film 2 to thereby cause a reaction in the presence of heat, light or both and manifest adhesiveness. Furthermore, the resin film 2 itself may be caused to exhibit tackiness, or a resin layer exhibiting tackiness may be laminated to the resin film 2. By disposing a functional filler in a film including this type of resin, depending on the functionality of the filler, a significant expansion of the application range of a method that uses the filler disposition film can be anticipated. An example of a method of using a filler disposition film for a case in which the fillers are conductive particles is described below.

For a case in which the fillers are conductive particles and the resin film 2 exhibits tackiness, the filler disposition film 1 may be used as an examination probe for examining the conduction of an electrode to be examined from an electronic component. In such a case, as illustrated in FIGS. 3A and 3B, the filler disposition film 1 can also be used in the formation of a conductive path which connects electrodes 11a and 11b of a first electronic component 10 with an electrode 13 of a second electronic component 12 interposed therebetween (for example, a conductive path between a conductive pattern provided on one side of a film-shaped actuator and a member to be bonded together with the conductive pattern, or a touch sensor), or a conductive path in a curved member having a thickness which is thin (for example, various types of thin film sensors). Note that the filler disposition film 1 can be used in the formation of a conductive path even for a case in which adhesiveness is manifest through heat or light curing. In this case, the position of the filler can be more rigidly fixed.

In addition, use of the filler disposition film of the present invention to improve the characteristics of an optical member (for example, JP 6020684 B) such as a light diffusion layer provided with surface irregularities through the filler can be anticipated. Furthermore, a design effect can also be obtained by bonding the filler disposition film to the surface of a targeted article. The manifestation of intended characteristics in the filler disposition film can also be anticipated by, for example, arranging or exposing the position of the filler in the thickness direction of the film.

The minimum melt viscosity and the viscosity at a prescribed temperature of a resin composition constituting the resin film 2 in the filler disposition film of the present invention can be determined, as appropriate, according to the characteristics (adhesiveness, curability and the like) of the resin composition, the application of the filler disposition film, and the method for producing the filler disposition film and the like. The viscosity including the minimum melt viscosity can be measured, for example, using a rotary rheometer (available from TA Instruments) and a measurement plate having a diameter of 8 mm while constantly maintaining a rate of temperature increase of 10° C./min and a measurement pressure of 5 g.

With regard to the viscosity of the resin composition constituting the resin film 2 of the filler disposition film of the present invention, in a case where the resin composition is a pressure-sensitive adhesive composition, the viscosity at 30° C. is generally from 100 to 100000 Pa·s. Furthermore, in a case where the resin composition is a curable resin composition, the minimum melt viscosity is preferably used as an index rather than using the viscosity at 30° C., which is significantly greater compared to the pressure-sensitive adhesive composition, as the index. The minimum melt viscosity ordinarily becomes from 100 to 1000000 Pa·s.

Moreover, for a case in which the filler disposition film 1 is bonded to an adherend such as a glass plate or a metal plate and the like with a well-known pressure-sensitive adhesive interposed therebetween and then used, the viscosity of the resin composition constituting the resin film 2 of the filler disposition film is preferably in a viscosity range that is equivalent to that of the pressure-sensitive adhesive.

Furthermore, since the filler disposition film 1 is subjected to a curing reaction or a polymerization reaction and used in the formation of a conductive path and the like, when determining the range of the minimum melt viscosity of the resin composition constituting the filler disposition film 1, consideration is preferably given to the perspective of forming concavities (2b of FIGS. 4 and 5, 2c of FIG. 6) near the conductive particles in the filler disposition film 1. This is because, as will be described later, as illustrated in FIG. 4 or 5, the concavity 2b is formed around the exposed portion of the filler P pushed into the resin film 2, and as illustrated in FIG. 6, the concavity 2c is formed directly above the filler P pushed into the resin film 2, and thereby contact between the filler in at least one film surface and the conductive material forming the conductive path can be improved. This is thought to be due to the ability to decrease the amount of resin at the outer circumference of the filler and directly above the filler in comparison to the amount of resin at a position where the filler is not present. When this perspective (namely, the perspective of forming concavities (2b in FIGS. 4 and 5, 2c in FIG. 6)) near the conductive particles in the filler disposition film 1 is considered, the minimum melt viscosity of the resin composition constituting the filler disposition film is preferably 1100 Ps·s or greater, and more preferably 1500 Pa·s or greater. Furthermore, when consideration is given to stably producing this type of conductive path, the minimum melt viscosity is preferably set to 2000 Pa·s or greater, more preferably from 3000 to 15000 Pa·s, and even more preferably from 3000 to 10000 Pa·s. Note that applications in which concavities (2b in FIGS. 4 and 5, 2c in FIG. 6) are formed near the filler are not limited to a case of conductive particles. The above is merely one example. Note that aspects in which concavities (2b in FIGS. 4 and 5, 2c in FIG. 6) are formed near the filler are not limited to aspects which conductive particles are used.

Furthermore, in a case where a step of pushing the filler into the resin film at a temperature of 40 to 80° C., and preferably 50 to 60° C. is implemented in the production of the filler disposition film 1, as described above, the viscosity at 60° C. of the resin composition constituting the resin film is preferably set to from 3000 to 20000 Pa·s from the perspective of forming the concavities 2b or 2c.

By appropriately selecting the viscosity of the resin constituting the resin film from a viscosity range like that described above, when the filler disposition film is used, in a case where the filler disposition film is interposed between articles to be connected such as opposing electronic components, and is reacted with the application of heat or light and the like while pressurizing, the matter of the filler inside the filler disposition film flowing due to the flow of the melted resin film can be prevented.

The film thickness La of the resin film 2 can be selected, as appropriate, according to the application and usage method of the filler disposition film and the like. However, when consideration is given to the shape following performance upon bonding the filler disposition film to another article, the lower limit of the film thickness La is preferably 2 μm or greater, more preferably 3 μm or greater, and even more preferably 6 μm or greater. In addition, when consideration is given to the volume when the filler disposition film is formed into a wound body, the upper limit is preferably 2 mm or less, more preferably 500 μm or less, and even more preferably less than 100 μm. Furthermore, in a case where the filler disposition film is used in the formation of a conductive path and the like, ordinarily, the film thickness La is preferably equal to or greater than the average particle diameter D of the filler P, but is not limited thereto for cases in which the filler P is exposed from the resin film 2. The film thickness La of the resin film 2 is, as one example, is sufficient to be 0.2 times the average particle diameter D or greater, preferably 0.3 times or greater, and more preferably 0.6 times or greater to delicately dispose the filler. When the film thickness La is 1 times or greater, production tends to become simple, and 2 times or greater is more preferable. The upper limit differs depending on the application, and is not particularly limited.

Moreover, for a case in which the filler disposition film is used in the formation of a conductive path and the like, when the conductive path is formed, in a case where the filler disposition film is held between members on which a conductive pattern is formed or between electronic components, and heat or light is applied while pressurizing to cause a reaction to adhere and connect, the ratio between the film thickness La and the average particle diameter D of the filler P (La/D) is sufficient to be 0.3 or greater, and preferably from 0.6 to 10.

The resin film 2 of the filler disposition film of the present invention may be a film which is detachably formed using a film formation method such as a method of coating onto a base material, and may be a film which is integrated with the base material.

Filler Disposition

The description of "regularly disposed" of the prescribed filler P in the filler disposition film of the present invention means that the prescribed filler P is not randomly disposed, and the prescribed filler has a two-dimensionally uniform disposition pattern in at least the surface direction of the film. Examples include a square lattice pattern, and a hexagonal lattice pattern. The filler is preferably disposed at these lattice points. However, the filler disposition pattern may also be a pattern that is not a lattice form.

As a regular disposition of the filler, a prescribed quantity of filler particles may be aggregated and disposed at prescribed lattice points. However, preferably there are no locations at which the filler is aggregated at a quantity of four times or more the prescribed quantity (for example, a location at which four or more fillers are irregularly aggregated and disposed at a lattice point where originally one filler is disposed), and more preferably, there are no quantities aggregated at three times or more. The number of irregularly aggregated fillers differ depending on the extent of aggregation, but ordinarily, the percentage of aggregation is preferably 10% or less, more preferably 5% or less, and even more preferably 2% or less based on the quantity.

Furthermore, the lower limit of the distance between filler centers (distance between lattice points) in the disposition pattern of the filler may be the distance at which filler particles contact (namely, the same as the average particle diameter of the filler particles), and is ordinarily 0.5 µm or greater, preferably 1 µm or greater, and more preferably 1.5 µm or greater. However, the upper limit thereof is determined according to the characteristics and the like that are to be exhibited by the filler disposition film, and therefore is not particularly limited. As one example, in a case where a buffer area becomes necessary in the implementation of operations on the filler disposition film such as cutting out and grasping, the buffer area is preferably formed by providing a distance of an extent of the distance between filler centers. Alternatively, the buffer area may be formed by using as the filler disposition, the disposition in which a prescribed lattice position is removed from a lattice position in the lattice arrangement. In other words, with the filler disposition film of the present invention, as long as the performance thereof does not significantly decrease, an area with an omission in the original disposition such as a lattice form, or a non-disposition area at which the filler P is not disposed may be intentionally included in the regular disposition of the filler P. The filler disposition pattern including such an area is preferably repeated in the long-side direction of the filler disposition film. In addition, areas of different dispositions with respect to the original lattice form or other such dispositions may be repeated in the long-side direction of the filler disposition film. In this case, the length of this repeating unit or of an integer multiple thereof can be set to the length of a rectangular area in which the rate of consistency of the filler disposition is observed.

Coding and lot control of the filler disposition film can be performed by repeating in the long-side direction of the filler disposition film, along with the original disposition of the filler P, the area in which an omission is present in the original lattice form or other such disposition of the filler P, the non-disposition area in which omissions are converged in the original disposition of the filler P, or the area in which the disposition differs from the original disposition. This is also effective at preventing forgery and improper use. For example, the film can be controlled by repeating an omission area of a prescribed shape including a plurality of omissions of the filler P, and by the rate of increase in omissions in the long-side direction of the film. Therefore, the shape of the omission area, the positional relationship, and the like are preferably recorded in advance. To record the omission of a prescribed position, the entire length of the filler disposition film may be photographed and recorded, or the filler disposition film may be photographed and recorded at prescribed intervals. In addition, randomly selected positions may be photographed and recorded. A method for controlling the filler disposition film can also be realized by marking in advance before and after the area in which an omission is present in the original disposition of the filler P, a non-disposition area, or an area of a different disposition, or by recording these areas. When such control is implemented, forgery or improper use of the filler disposition film of the present invention can be prevented. In addition, since the consistency of the filler increases, when an omission is present, the characteristic thereof becomes prominent. Furthermore, details such as the shape of the omission area are of a level that cannot be observed visually, and therefore an advantageous effect can be anticipated with this type of method. The length of the area in which an omission is present in the original disposition of the filler P, the non-disposition area, or the area of a different disposition differs depending on the method of using the film, but as one example, from the perspectives of operability and the omission allowance of the film, the length may be 400 mm or less, preferably 20 mm or less, and more preferably 5 mm or less. Note that for a case in which the filler disposition film has such an area, when the filler disposition film is used, the adhesion position of the film to the articles to be connected is preferably adjusted with respect to the filler disposition film.

Note that for cases in which the filler disposition film includes an area with significant filler omission (for example, a portion at which 10 or more omissions are converged), an area excluding that area can also be used as the filler disposition film of the present invention. By marking either before or after this area not suited for use, continuous use of the film wound body can also be facilitated.

Furthermore, with regard to the filler "disposition", regularity in the thickness direction of the film may also be provided. For example, the position of an apical part of each filler may be aligned in the thickness direction of the filler disposition film, and the filler is preferably disposed so as to be flush in the surface direction of the filler disposition film. In this case, the filler may be exposed from the resin film, or may be fully embedded. For example, as illustrated in FIGS. 4 and 5, by aligning the position in the film thickness direction of the apical part Pa of the filler P, in a case where the filler disposition films 1A, 1B are bonded to a targeted article through pressurization (in some cases, pressurization accompanied with the further application of heat or light, and the like), the pressurization state in the bonding area becomes uniform, and unevenness is not easily generated in the adhesion state. On the other hand, even in a case where all filler particles are not disposed in a flush manner, the filler position in the film thickness direction may be regularly aligned so that surface irregularities are present with every other filler particle, for example. In this case as well, a substantially similar effect can be obtained. Furthermore, this type of filler for which the position in the film thickness direction is aligned may be disposed at both sides of the film, and can be obtained by performing lamination of the filler disposition films or the same operation on both sides.

The embedding state of the filler in the resin film is not particularly limited, but for a case in which conductive particles are used as the filler, and the filler disposition film is held between various opposing electronic components, and is adhered and connected by pressurizing, and applying heat or light as necessary, or a case in which the filler disposition film is used in an application such as forming a conductive path by interposing the filler disposition film, as illustrated in FIGS. 4 and 5, preferably the filler P is partially exposed from the resin film 2, and a concavity 2b is formed around the exposed portion of the filler P with respect to a tangent plane 2p of the surface 2a of the resin film 2 at a central portion between adjacent fillers P, or as illustrated in FIG. 6, a concavity 2c is formed with respect to the same tangent plane 2p described above in a resin film portion directly above the filler P embedded in the resin film 2, and waviness is present in the surface of the resin film 2 directly above the filler P. In addition, when the filler disposition film is held and pressurized between electrodes of electronic components, and is bonded and connected by the application of heat or light as necessary, contact of the filler P against the electrodes is generated (flattened depending on the type of filler), and with respect to the generation of such contact, the concavities 2b illustrated in FIG. 4 are present, and thereby the resistance that the filler P receives from the resin is reduced in comparison to a case in which the concavities 2b are not present. Therefore, the filler P is more easily held between opposing electrodes, and conduction performance is also improved. In other words, by simply configuring so that a portion of the resin is missing, contact is facilitated between a terminal and the filler, which is a conductive particle. In addition, of the resin constituting the resin film 2, concavities 2c (FIG. 6) are formed in the surface of the resin directly above the fillers P. Thus, the pressure at the time of pressurization is more easily concentrated on the filler P in comparison to case in which the concavities 2c are not present, and therefore the filler P is more easily held by the electrodes, and conduction performance is improved. Note that with regard to the present invention, the embedded state of these fillers is not limited to a case in which the fillers are conductive particles. For example, in a case where an organic filler is used as the filler, and the filler disposition film is used in an application of an artificial skin (for example, see JP 2004-230041 A), the texture and the like can be finely adjusted from the type, number density, and distance from the film surface (presence, lack of exposure, or the like) of the filler, and therefore usefulness can be expected.

From the perspective of being able to more easily obtain the above-described advantageous effect of the concavities 2b, a ratio (Lb/D) (hereinafter, referred to as an embedding percentage) between a distance Lb (hereinafter, referred to as an embedded amount) of the deepest part of the filler P from the tangent plane 2p, and the average particle diameter D of the filler P is sufficient to be 20% or greater, preferably 30% or greater, and more preferably 60% or greater and 105% or less.

From a similar perspective, a ratio (Le/D) of a maximum depth Le of the concavity 2b (FIGS. 4 and 5) around the exposed portion of the filler P to the average particle diameter D of the filler P is preferably less than 50%, more preferably less than 30%, and even more preferably 20 to 25%. A ratio (Ld/D) of a maximum diameter Ld of the concavity 2b (FIGS. 4 and 5) around the exposed portion of the filler P to the average particle diameter D of the filler P is preferably 150% or less, and more preferably 100 to 130%. A ratio (Lf/D) of a maximum depth Lf of the concavity 2c (FIG. 6) in the resin directly above the filler P to the average particle diameter D of the filler P is 10% or less.

Note that the diameter Lc of the exposed portion of the filler P can be set to be equal to or less than the average particle diameter D of the filler P, and the filler P may be exposed at one apical part Pa of the filler P, or the filler P may be fully embedded in the resin film 2 such that the diameter Lc becomes zero. From the viewpoints of achieving both the exposure effect and fixing of the filler, the diameter Lc may be set from 20 to 80%.

Rate of Consistency of Filler Disposition

In the present invention, the "rate of consistency of the filler disposition" is a term which expresses as a "%" the ratio of the extent of overlap of center dispositions of regularly disposed fillers in rectangular areas of a prescribed size having a width of 0.2 mm or greater and a length of 1000 times or greater than the average particle diameter of a prescribed filler P from amongst fillers regularly disposed in a filler disposition film towards a direction of low number density using, of both end parts of a prescribed length of the film, the end part having high filler number density as a reference. That is, the rate of consistency of the filler disposition is a ratio of the number of overlapped prescribed fillers to the total number of fillers in both areas in a case in which both rectangular areas are made to overlap such that the number of fillers for which the center position overlaps is maximized. In this case, as the center position, consider a circular area of a prescribed diameter that is not more than 25% of the average particle diameter of the filler and preferably not more than 10%. Overlap of this type of filler can be determined by capturing images of both rectangular areas, and then overlapping the images through image processing. In a case where the distance between fillers is small, the probability of overlapping becomes high, and measurement errors could occur. Therefore, the minimum distance between fillers is preferably such that the fillers are separated by a distance that is more than 80% of the average particle diameter of the filler.

As a specific method for calculating the rate of consistency, for example, consider a case in which the number of fillers disposed in a lattice in a rectangular area 3a of a prescribed size is 100, and a quantity of 100 fillers is disposed in a rectangular area 3b of the same size in the same lattice form as that of the rectangular area 3a, but two of those 100 fillers are significantly shifted by more than a prescribed extent (for example, 10% of the average particle diameter of the filler) from the position at which they were originally to be present, and therefore when the rectangular area 3a and the rectangular area 3b are overlapped so that the number of overlapping fillers between the fillers of the rectangular area 3a and the fillers of the rectangular area 3b is maximized, the number of fillers that do not overlap is four, and the number of fillers that overlap is 196, and thus the "rate of consistency of the filler disposition" can be calculated as 196×100/200=98%. This can be performed using a well-known observation device such as a metallurgical microscope or SEM. In addition, well-known image analysis software (WinROOF from Mitani Corporation) may also be used.

Note that when calculating the rate of consistency of the filler in the rectangular areas, preferably, one rectangular area is used as an end part in the long-side direction of the filler disposition film, and the rate of consistency is calculated based thereon. Through this, the rate of consistency can be easily calculated, and the rate of consistency in the filler disposition film can be easily compared. In addition, given that the side with a high number density of both end parts in the long-side direction of the filler disposition film is used as a reference, it is thought that the rate of consistency can be more easily compared.

Furthermore, the "prescribed size" of one of the rectangular areas when calculating the "rate of consistency of the filler disposition" means a rectangular area having a length of at least 1000 times, preferably at least 5000 times, and more preferably at least 10000 times the average particle diameter of the prescribed filler, and from the perspective of slit processability, having a width of 0.2 mm or greater, preferably 1 mm or greater, and more preferably 10 mm or greater. Here, the width of the rectangular area may be the length of the entire short-side direction of the film, may be a portion excluding both ends (for example, 20% of each end) in the short-side direction of the film, or may be an area of only the end portion of the film (for example, a portion excluding 40% of the center). Note that the upper limit of the length in the long-side direction of the rectangular area is preferably not more than 50000 times, and more preferably not more than 20000 times the average particle diameter of the filler, and the upper limit of the width in the short-side direction of the rectangular area is preferably not greater than 500 mm, more preferably not greater than 300 mm, and even more preferably not greater than 150 mm.

Preferably, the long-side direction of the rectangular area is substantially parallel to the long-side direction of the filler disposition film (within ±15 degrees with respect to the long-side direction), and the widthwise direction of the rectangular area is substantially parallel to the short-side direction of the filler disposition film (within ±15 degrees with respect to the short-side direction). Furthermore, preferably, a rectangular area having a rate of consistency of 90% or greater, preferably 95% or greater, and more preferably 98% or greater is repeatedly formed along the long-side direction of the film.

Filler Size

The prescribed size (average particle diameter) of the filler P that forms the basis for determining the size of the rectangular area is preferably at least 400 nm, which is the lower limit of the wavelength of visible light, more preferably at least 800 nm (0.8 µm), even more preferably at least 1000 nm (1 µm), and yet even more preferably at least 1500 nm (1.5 µm). The upper limit is preferably not greater than 1000 µm, more preferably not greater than 500 µm, even more preferably not greater than 100 µm, and yet even more preferably not greater than 50 µm. The upper limit may also be not greater than 30 µm. Note that in a case where the filler size is 1 µm or greater, the average particle diameter of the filler can be measured using a well-known image type particle size distribution measurement device. An example of this type of measurement device is the FPIA-3000 (from Malvern Panalytical Ltd.). Note that for a case in which the filler is independent, the average particle diameter indicates the maximum measured length when the method causes the filler to flow and measures the filler, and for a case in which the filler is disposed in the film, the average particle diameter indicates the maximum length in a surface field of view. An average of the maximum values of individual fillers obtained thereby is the average particle diameter. The filler size can also be observed from a surface field of view using an optical microscope, a metallurgical microscope, or the like, and can be measured using image analysis software such as WinROOF (from Mitani Corporation). Furthermore, when the filler size is less than 1 µm, the filler size can be determined through observation using an electron microscope (SEM, and the like). This type of technique can be appropriately selected according to the size of the filler. Note that the shape of the filler is preferably spherical. Here, "spherical" includes a true sphere and a shape similar thereto. More specifically, a spherical form is a shape with sphericity from 70 to 100, and preferably from 75 to 100. Sphericity can be calculated by the following equation.

Sphericity=$\{1-(So-Si)/So\} \times 100$

In the equation, So is an area of a circumscribed circle of the filler in a plane image of the filler, and Si is an area of an inscribed circle of the filler in the plane image of the filler. Note that the number N of fillers is 100 or more, preferably 200 or more, and more preferably 300 or more.

Even with a cross-section of the film, the area of a circumscribed circle and the area of an inscribed circle of the filler in a cross-sectional image of the filler can be similarly observed, and can be determined in the same manner as the above-described case for a surface field of view, and the sphericity of the cross-section can also be determined. In this case as well, a range that is the same as that of the surface field of view is preferable. Moreover, the difference of the sphericity between a surface field of view and a cross-sectional view is preferably small, and more specifically, is within 20, more preferably within 10, and even more preferably within 8, In a case where the filler is a shape that is close to spherical, the CV value is, for example, preferably 20% or less. This is because in order to increase the consistency of the disposition, the size of the filler is preferably within a prescribed range.

Filler Number Density from Plan View

The number density from a plan view of the filler P regularly disposed in the filler disposition film of the present invention is not particularly limited as long as excessive duplication that would make it impossible to recognize the filler disposition is not present. However, when the number density is too small, the consistency of the disposition becomes difficult to confirm, and therefore as one example, the lower limit of the number density is preferably at least 100 fillers/cm$^2$, and more preferably at least 500 fillers/cm$^2$. Since observation is facilitated by making the reference area smaller, the consistency of the disposition can be more easily confirmed when the number density is at least 5 fillers/mm$^2$, and preferably at least 15 fillers/mm$^2$. When the number density is too large, man-hours are required to confirm the disposition precision, and therefore as one example, the upper limit is preferably not greater than 50000000 fillers/cm$^2$, more preferably not greater than 5000000 fillers/cm$^2$, and even more preferably not greater than 2500000 fillers/cm$^2$. Since observation is facilitated by making the reference area smaller, the number density may be set to not greater than 200000 fillers/mm$^2$, and when set to not greater than 90000 fillers/mm$^2$, the disposition precision can be more easily confirmed. When set to this range, the filler may be disposed with changes in density to impart a design characteristic, for example. For example, by imparting luster to the film, imparting a matte finish on the film, mixing a colored filler into the film surface, imparting a prescribed friction coefficient to the film and the like, optimization with respect to applications such as various optical films, artificial skins, and regenerative medicine and the like can be performed in the above-described number density range.

Filler Constituent Material

The filler P constituting the filler disposition film of the present invention can be appropriately selected from amongst various commercially available fillers and used. The material thereof may be an inorganic substance, or may be an organic substance. The material may also be a composite material in which these substances are formed into a plurality of layers. More specifically, examples include metal particles, resin particles, metal-coated resin particles (conductive particles), pigments, dyes, and crystalline inorganic substances. The material may also be one for which a crystalline organic material or inorganic material has been crushed. Furthermore, the surfaces of these particles may be coated with yet another substance. Examples include resin particles or metal-coated resin particles for which the surfaces are coated with insulating microparticles or an insulating resin. Note that in a case where the filler is water-soluble, a resin film in which holes are formed as regular concave portions can be obtained by subjecting the filler disposition film to a treatment in which the water-soluble filler is eluted in water. For example, use in a permeable membrane or an osmosis membrane and the like is conceivable. Use of these membranes in life science applications including in the environmental field for desalination of ocean water, and the like can be anticipated.

Moreover, the filler P constituting the filler disposition film of the present invention may be a medical drug, enzyme, or the like that has been formed into a filler. The ability to elaborately confirm and verify the filler efficacy can be anticipated by preparing films with different number densities of conductive particles as films in which these types of fillers are disposed. For example, since the total amount of a filler having pharmacological activity in a filler disposition film can be made to directly contact the action target area of a test subject, the usage amount of the filler necessary for achieving the same effect can be suppressed. In addition, use can also be anticipated in applications in which contact is caused with cultured cells and the like separated from the human body for regenerative medicine and the like and detailed verifications are performed. These of course are merely examples of possible applications.

The shape of the filler is not particularly limited, and may be spherical, squamous, rectangular parallelepiped, a rugby ball shape, a cube shape, or the like. In addition, projections, concavities, grooves and the like may be present at the surface, and the filler may be porous or hollow. Of these, the filler is preferably spherical from the perspective of designing the filler disposition. In addition, the specific gravity of the filler is not particularly limited, and can be within a wide range according to the filler material (for example, metal, and organic polymer), crosslinking density and the like. For example, the specific gravity of Au, which is a material that is generally used in electronic components, is 19.3, the specific gravity of Ag is 10.49, and the specific gravity of organic polymers is ordinarily from 0.8 to 1.0 or greater. Therefore, the range of the specific gravity of the filler is ordinarily from 0.8 to 23, and preferably from 0.9 to 20.

The filler P regularly disposed in this manner preferably has substantially the same shape, but a filler of a different size, shape and material may be mixed therein. For cases in which fillers of different sizes and shapes are mixed in, the repeating unit of the disposition of the entire filler can be observed by the disposition of the filler P of the prescribed size and shape, and therefore the repeating unit can be used as an index for determining the regularity of the filler disposition. The same applies to a case in which the filler includes a plurality of types. An example of this type of other filler is a powder (powder for which a crystalline resin or such has been melted and has undergone a phase change) having a thermal expansion coefficient that is 100 times or more greater than the material of the resin film. This type of powder can impart, to the filler disposition film, function as a temperature element that uses the difference in the thermal expansion coefficients of the resin and powder (see JP 5763355 B). Moreover, in addition to the combined use of a plurality of types of fillers, the composition and the like of the resin film that is used can be changed to thereby impart, to the filler disposition film, the functions of various sensing elements (touch sensor, pressure-sensitive sensor and the like), optical elements (reflection prevention, anti-glare treatment) and the like. The filler disposition film may also be used as an optical member such as in a light diffusion layer provided with surface irregularities through the filler (see JP 6020684 B). Improvements in the characteristics of such an optical member can be anticipated.

The filler disposition film may also be used in an electrode, permeable membrane, or other such product for which the performance is varied by the surface area. Note that a filler that is different from the filler P disposed in a regular disposition pattern (for example, a nanofiller less than 400 nm in size, a powder for which the above-described thermal expansion coefficient is greater by 100 times or more, or other such filler having a different function) may be used in combination with the filler P in the filler disposition film of the present invention. This type of different filler may be randomly present without being disposed in a prescribed disposition pattern.

Furthermore, as described above, the filler disposition film can also be used as a connection member for forming a conductive path, and by disposing the filler in a pressure-sensitive adhesive film (pressure-sensitive adhesive layer), such a filler disposition film can also be used for certification of a targeted article that uses the pressure-sensitive adhesive film (pressure-sensitive adhesive layer). For example, by using a pressure-sensitive adhesive film (pressure-sensitive adhesive layer) characterized by the filler disposition, when the disposition thereof is recorded in advance, it is thought that the capability for use as evidence in the event of improper use is increased.

Method for Producing Filler Disposition Film

"Filler disposition" in the production of the filler disposition film can be performed using a well-known technique. For example, a filler disposition film in which the filler is held in a resin film at a prescribed disposition can be produced by fabricating a master having concave portions in which fillers are disposed using mechanical processing, photolithography, a printing method, or the like, filling the concave portions with fillers, applying a resin composition that forms a resin film thereon, and curing the resin composition to form a resin film. In this case, to provide a repeating unit (regular disposition of the filler) in the long-side direction of the film, the master may be formed into a cylinder, and the disposition location on the outer surface may be processed. Note that even when the master is formed into a cylindrical shape or a non-cylindrical shape, joints may be formed, or joints may not be formed (because of changes due to the film material and production speed). In a case where a joint is present and the disposition is not shifted by the joint, an area that includes the joint can be used as a repeating unit.

Furthermore, the filler disposition film may also be produced by filling the above-described concave portions of the master with fillers, and then covering the top thereof with the resin film, transferring the fillers from the concave portions of the master to the surface of the resin film, and then pushing the filler on the resin film into the resin film. The embedded amount (Lb) of the filler can be adjusted by the pressing force and temperature and the like at the time of this pushing. Also, the shape and depth of the concavities $2b$ and $2c$ can be adjusted by the viscosity of the resin film 2, the pushing speed, the temperature, and the like at the time of pushing. For example, for a case in which a filler disposition film 1A having the concavities $2b$ illustrated in FIG. 4 in the surface of the resin film is produced, and for a case in which a filler disposition film 1C having the concavities $2c$ illustrated in FIG. 6 is produced, the specific viscosity of the resin film 2 when pushing the conductive particles into the resin film 2 is such that, according to the shape, the depth and the like of the incline $2b$ and the relief $2c$ to be formed, the lower limit is preferably 3000 Pa·s or greater, more preferably 4000 Pa·s or greater, and even more preferably 4500 Pa·s or greater, and the upper limit is preferably 20000 Pa·s or less, more preferably 15000 Pa·s or less, and even more preferably 10000 Pa·s or less. Moreover, such viscosity is obtained preferably at 40 to 80° C., and more preferably at 50 to 60° C.

Filler Disposition Film Application and Usage Method

Various functions can be imparted to the filler disposition film of the present invention by varying the materials, dimensions, and physical, chemical, mechanical, or optical characteristics of the filler and resin film that are used. Therefore, the filler disposition film of the present invention is not limited to use in specific applications, and depending on the function, can be used in various applications. For example, in the electronics field, the filler disposition film can be used as a conductive film, a heat dissipating film, a pressure sensitive film and the like, and in the life sciences fields (for example, fields such as medical care, bioscience, health care, and the environment), the filler disposition film can be used as a biosensor, diagnostic device, medical treatment or clinical testing device and the like, and may be used as an optical element. The filler disposition film of the present invention may also be used in battery and energy related applications, and in on-board (vehicle) applications. The rate of consistency of the filler is particularly high and therefore the filler disposition itself can be used as a benchmark, and thus can be useful in applications in medical care and bioscience, in understanding and resolving problems that arise in processes from research to practical applications. Furthermore, in applications in which conductive paths are formed in the electronic components, the conduction property can be improved, and therefore the filler disposition film can be used in touch panels and touch sensors, for example. A conductive path of the film body can be easily formed, and therefore the filler disposition film can be used in drive portions of mechanical devices. For example, the filler disposition film can be used in robot arms and drones. The filler disposition film of the present invention can also be used as a spacer such as a gap spacer for a liquid crystal display, and can also be used in applications for achieving thinner designs, more compact, and more lightweight designs, and improved durability in known functional elements and devices. The filler disposition film of the present invention can also be used in applications to improve the design property and surface wear resistance of other articles by affixing or transferring the filler disposition film to the other articles. Applications are not limited to those described above, and the film can also be used in production steps for various members. In other words, the usage method may also be one which does not incorporate the filler disposition film into a final member. The filler disposition film can also be wound onto a winding core and used as a film wound body. Carrying and processing are facilitated by forming a film wound body, and therefore use is also facilitated. This can also be easily formed into a sheet.

The method of using the filler disposition film of the present invention can be appropriately selected according to the application. For example, in a case where the filler disposition film is to be used to form a conductive path, the filler disposition film can be held between components on which conductive patterns are formed, and can be heated and pressed between the components on which conductive patterns are formed. Moreover, when used as an OCA, OCR or other such optical film, artificial skin or the like, the filler disposition film can be affixed to the targeted article and used. In addition to use as artificial skin, for cases in which acrylic crosslinking beads are used as the filler, the filler disposition film of the present invention can be applied to a light control sheet or unit lens (for example, see JP 2007-003571 A); for cases in which a thermally conductive filler such a ceramic particles is used as the filler (for example, see JP 2016-126843 A), the filler disposition film can be applied to an anisotropic thermally conductive sheet; and for cases in which gaps between a plurality of fillers of a filler disposition film are used as grooves, the filler disposition film can be applied to a regeneration film for tissues (nerve or tendon) (for example, see JP 5468783 B). The filler disposition film can also be used simply as a mold for the formation of holes.

Note that for cases in which the filler disposition film of the present invention is applied to an optical functional resin layer such as an OCA or OCR polymer layer, the thickness thereof is not particularly limited, but as the optical functional resin layer becomes thinner, there is a tendency for the generation of air bubbles to become more difficult at the time of temporary pressure bonding. Other usage methods include light irradiating the OCR and the like prior to curing or such to produce the filler disposition film, or light irradiating and bonding together. Another usage method is similarly light irradiating the OCA as well, and bonding together. Therefore, the thickness of these optical functional resin layers is, for example, preferably not more than 250 µm, and more preferably not more than 100 µm. Furthermore, the tensile elastic modulus of the optical functional resin layer is not particularly limited, and, for example, may be 10 to 200 KPa. Alternatively, the storage elastic modulus at 25° C. may be $1\times10^3$ to $2\times10^6$ Pa.

Note that the film length for a case in which the filler disposition film is a film having adhesiveness or pressure-sensitive adhesiveness and the like is preferably 5 m or greater, and more preferably 10 m or greater, and from the perspectives of preventing protruding and blocking and ensuring ease of handling, the upper limit is preferably 5000 m or less, more preferably 1000 m or less, and even more preferably 500 m or less. These also include the length for a case in which the film is joined together by adhesive tape and the like. This preferably indicates the total length of the film wound onto a winding core for a case in which the film is formed into a wound body, but more preferably indicates the individual lengths of films that have been joined together. In this case, the length depends on the usage application, and therefore is not particularly limited, but as one example, the lower limit is preferably 0.5 m or greater, more preferably 1 m or greater, and even more preferably 3 m or greater. As will be described below, this is because in a case where individual films are wound onto a winding core, winding each individual film onto the winding core by an amount of one circumferential portion or greater is preferable for quality control. Also, in a case where the film is not an adhesive or pressure-sensitive adhesive film, the total length of the film may be 5000 m or greater, and for example, may be 8000 m or greater, and from the perspective of ensuring ease of handling, the upper limit is preferably 5000 m or less, more preferably 1000 m or less, and even more preferably 500 m or less. In addition, the lower limit may be such that the film can be wound onto the winding core, and therefore the lower limit is preferably 0.5 m or greater, more preferably 1 m or greater, and even more preferably 3 m or greater.

EXAMPLES

The present invention will be described in more detail below with reference to examples.

Example 1

Producing Film-Shaped Master

First, a master used in the examples was prepared. Namely, a nickel plate having a thickness of 2 mm was prepared, a conically-shaped convex portion (outer diameter of 7 μm and a height of 7 μm) was formed in a hexagonal lattice pattern in a 50 cm square area of the nickel plate, and a transfer body master was thereby obtained. The distance between the centers of adjacent convex portions was 10 μm.

Next, a polyethylene terephthalate base material film with a width of 50 cm and a thickness of 50 μm was prepared premised on splitting into ten sections, each 5 cm wide, and a photocurable resin composition containing 100 parts by mass of an acrylate resin (M208 from Toagosei Co., Ltd.) and 2 parts by mass of a photopolymerization initiator (IRGACURE 184, from BASF Japan Ltd.) was applied onto the base material film so that the film thickness became 30 μm.

The transfer body master made of nickel was pressed from the convex surface into the obtained photocurable resin composition film, and light irradiation was performed from the base material film side using a high pressure mercury lamp (1000 mJ), and thereby a photocurable resin layer in which the convex portions of the transfer body master had been transferred as concave portions was formed. This operation was continuously repeated while positioning in the long-side direction of the base material film, and thereby an approximately 100 m film-shaped master on which the convex portions of the transfer body master were transferred as concave portions was obtained. Circular concave portions having a diameter of 7 μm and a depth of 7 μm (aspect ratio of 1) were disposed on the obtained film-shaped master in a hexagonal lattice form with a distance between centers of the concave portions of 10 μm.

Optional 1 mm$^2$ areas of the obtained film-shaped master were selected at 1000 places, and the number of concave portions in each area was measured using an optical microscope. The surface density of the concave portions was also calculated by dividing the total number of concave portions measured in each area by the total surface area of the areas. As a result, the surface density of the concave portions was 11500 concave portions/mm$^2$=1150000 concave portions/cm$^2$.

Preparation of the Filler Disposition Film

A resin filler (MA1006 from Nippon Shokubai Co., Ltd.) was prepared, and the resin filler was classified so that the average diameter was 5 μm. Note that the diameter of the resin filler is the diameter of each particle of the resin filler when regarded as a sphere, or in other words, is the sphere equivalent diameter. Furthermore, the average diameter is the arithmetic average of the resin filler diameter. The CV value was 20% or less. These measurements were performed using the FIPA-3000 image type particle size distribution analyzer (from Malvern Panalytical Ltd.). The resin filler classified in this manner was scattered onto the surface of the film-shaped master, and next, the filler was wiped with a cloth to fill the concave portions of the master film with the filler.

Next, a resin film formed from an insulating pressure-sensitive adhesive composition containing 60 part by mass of a phenoxy resin (YP-50 from Nippon Steel & Sumikin Chemical Co., Ltd.), 40 parts by mass of an epoxy resin (jER828 from Mitsubishi Chemical Corp.), 2 parts by mass of a cationic curing agent (SI-60L from Sanshin Chemical Industry Co., Ltd.), and 20 parts by mass of silica microparticles (Aerosil RY 200 from Nippon Aerosil Co., Ltd.) was prepared with the same width and length as that of the film-shaped master. The resin film was pressed against the resin filler disposition surface of the film-shaped master at a temperature of 60° C. and a pressure of 0.5 MPa, and thereby the resin filler was transferred to the resin film, and simultaneous thereto, the resin filler was embedded into the resin film. Then, the resin film was slit into widths of 2 cm, and each slit was wound onto a winding core, and thereby 25 rolls of filler disposition film were obtained with the resin filler disposed flush with the surface of the resin film in a normal hexagonal lattice form. When the number density of conductive particles at the winding core side end part and the winding ending side end part of each filler disposition film was measured, the winding core side end part (in other words, the starting end part when starting the transfer) exhibited a slightly greater value.

This filler disposition film roll was temporarily rewound onto a different winding core, and using the tip end edge of the winding ending side (edge when transfer begins, or in other words, the reference area) as a starting point, the resin filler disposition and aggregation state were confirmed in an area of 10 mm in the film width direction of a center part in the film width direction at each location of 0.1 m, 1 m, 5 m, 10 m, 30 m, 35 m, 50 m, 50.1 m, 60 m, 75 m, 90 m, 90.2 m, and 100 m from the tip end, and 5 mm in the long-side direction from each location. Aggregation of the resin filler (connecting body of three or more fillers) was not observed. Furthermore, with regard to positional shifting of the filler disposition disposed in a normal hexagonal lattice-form at each location with respect to the filler disposition in the reference area, shifting of 0.5 μm (10% of the particle diameter) or more was measured as positional shifting. Using the counted number of fillers as the denominator, and a value obtained by subtracting the number of positionally shifted fillers from the number of counted fillers as the numerator, a numeric value obtained by dividing the numerator by the denominator and then multiplying the obtained value by 100 was used as the "rate of consistency of filler disposition" at each location. The arithmetic mean of multiple rates of consistency obtained for each roll was found, and that value was used as the rate of consistency of the filler disposition film.

It was confirmed that the 25 filler disposition film rolls that were obtained exhibited a high rate of consistency that was larger than 99.9% at the center part before slitting. In addition, when the other film rolls were similarly confirmed, it was confirmed that even the film roll with the lowest rate of consistency had a rate of consistency that was 90% or greater. Note that all of the film rolls exhibited a rate of consistency of 98% or greater up to at least the 1 m location. In addition, a tendency for the rate of consistency to decrease as the transfer progressed was exhibited.

Comparative Example 1

The film-shaped master used in Example 1 was cut to a length of 30 cm such that the 1 m location became the center, and the obtained film-shaped master with a length of 30 cm was repeatedly used and subjected to the operation of Example 1 fifty times to thereby prepare a filler disposition film. The filler disposition film that was obtained when the film-shaped master was used the 50th time was slit and evaluated in the same manner as Example 1, and thereby 25 filler disposition films were obtained in Comparative Example 1 as well. Namely, in case of "the film-shaped master being regarded as a cylindrical master", the filler disposition film obtained when the film-shaped master was used the 50th time was evaluated as a filler disposition film obtained when such a cylindrical master being used the 50th rotation time.

When the 25 filler disposition films that were obtained were evaluated in the same manner as Example 1, it was confirmed that even the film with the highest rate of consistency had a rate of consistency that was less than 90%. In addition, the occurrence of aggregation of four or more fillers was observed multiple times. In addition, a tendency for the rate of consistency to decrease as the transfer progressed was exhibited. When the filler number density was compared with that at the same location as Example 1, a significant decrease in number density was confirmed.

INDUSTRIAL APPLICABILITY

The filler disposition film of the present invention is configured using various fillers that can be procured from the marketplace, and the precision of the disposition position of the filler is high even when the surface area is made large. Accordingly, the present invention is suitable for a wide range of fields of application. As an example, the present invention can be used in the electronics field, and is also useful in medical care, bioscience, health care, the environmental field, and the agricultural field and other such life science fields with applications in devices such as biosensors and diagnostic devices.

REFERENCE SIGNS LIST 1, 1A, 1B, 1C Filler disposition film
2 Resin film
2p Tangent plane
3a, 3b Rectangular area
10 First electronic component
11a, 11b Electrode of first electronic component
12 Second electronic component
13 Electrode of second electronic component
D Filler average particle diameter
L1 Length of rectangular area in film long-side direction
L2 Width of rectangular area
La Film thickness
Lb Filler embedded amount
Lc Diameter of exposed portion of filler
Ld Maximum diameter of concavity around exposed portion of filler
Le Maximum depth of concavity around exposed portion of filler
Lf Maximum depth of concavity in resin directly above filler
P Filler
Pa Filler apical part

The invention claimed is:

1. A filler disposition film, wherein the filler disposition film is wound onto a winding core to form a film wound body, the filler disposition film comprising:
 a resin film comprising a film length of 5 m or more and a film width and having fillers having an average particle diameter of 100 μm or less being regularly disposed in a two-dimensional lattice disposition pattern, wherein a rate of consistency of disposition of the fillers in rectangular areas repeated along the film length is 90% or greater, each rectangular area having a predetermined size comprising a length substantially parallel to the film length of 1000 times or more of the average particle diameter of the filler and a width substantially parallel to the film width of 0.2 mm or greater,
  wherein the rate of consistency of disposition of the fillers is measured by capturing images of any two rectangular areas and then overlapping the images via imaging processing such that a number of the fillers for which a center position overlaps is maximized, the center position being a circular area of diameter not more than 25% of the average particle diameter of the filler, wherein the rate of consistency of disposition of the filler is a ratio of the number of overlapped fillers to a total number of fillers in the two rectangular areas, and
 wherein the filler disposition film further comprises at least one of:
  (i) predetermined filler omission locations repeated along the film length, each filler omission location being a filler that is absent/removed from the lattice disposition pattern,
  (ii) predetermined filler omission areas repeated along the film length, each filler omission area being multiple fillers that are absent/removed in a converged area from the lattice disposition pattern,
  (iii) predetermined different disposition areas repeated along the film length, each different disposition area being the fillers regularly disposed in a pattern different from the lattice disposition pattern.

2. The filler disposition film of claim 1, wherein the rate of consistency of disposition of the fillers is 98% or greater.

3. The filler disposition film of claim 1, wherein the average particle diameter is 400 nm or greater.

4. The filler disposition film of claim 1, wherein the diameter of the circular area is not more than 10% of the average particle diameter.

5. The filler disposition film of claim 1, wherein a minimum distance between the fillers is more than 80% of the average particle diameter of the filler.

6. The filler disposition film of claim 1, wherein the rectangular areas are regularly or randomly located along the film length.

7. The filler disposition film of claim 1, wherein the length of each rectangular area is 50,000 times or less the average particle diameter of the filler.

8. The filler disposition film of claim 1, wherein the width of each rectangular area is 500 mm or less.

9. The filler disposition film of claim 1, wherein the film length is up to 5,000 m.

10. The filler disposition film of claim 1, wherein a number density of the fillers is from 100 fillers/cm$^2$ to 50,000,000 fillers/cm$^2$.

11. The filler disposition film of claim 1, wherein the fillers comprise metal particles, resin particles, metal-coated resin particles, and/or ceramic particles.

12. The filler disposition film of claim 1, wherein the fillers have substantially the same shape and size.

13. The filler disposition film of claim 12, further comprising fillers of a different size, shape, and/or material mixed therein, wherein a repeated unit of the disposition of fillers is observed by the disposition of the fillers having substantially the same shape and size, wherein the repeating unit can be used as an index for determining regularity of filler disposition.

14. The filler disposition film of claim 1, wherein the filler disposition film comprises irregularly aggregated fillers, wherein an irregularly aggregated filler is a lattice location comprising two or more disposed fillers, and a percentage of irregularly aggregated fillers is 10% or less.

15. The filler disposition film of claim 1, wherein the fillers are flush with a film surface of the resin film.

16. The filler disposition film of claim 15, wherein fillers are exposed at the film surface of the resin film and a corresponding concavity is formed around the exposed portion of the filler.

17. The filler disposition film of claim 1, wherein a length of the predetermined filler omission locations, predetermined filler omission areas, or the predetermined different disposition areas is 400 mm or less.

18. The filler disposition film of claim 1, wherein at least one of predetermined filler omission locations or predetermined filler omission areas is formed as a buffer zone for cutting out and grasping or wherein the predetermined filler omission locations, predetermined filler omission areas, or the predetermined different disposition areas are formed as zones for coding and lot control.

19. A method for controlling the filler disposition film of claim 1, the method comprising: marking in advance or photographing and recording the predetermined filler omission locations, predetermined filler omission areas, or the predetermined different disposition areas.

20. A conductive film comprising the filler deposition film of claim 1, wherein the fillers are conductive particles.

21. An anisotropic thermally-conductive film comprising the filler disposition film of claim 1, wherein the fillers are thermally conductive fillers.

\* \* \* \* \*